United States Patent [19]
Wilson

[11] Patent Number: 6,037,621
[45] Date of Patent: Mar. 14, 2000

[54] ON-CHIP CAPACITOR STRUCTURE

[75] Inventor: William Burdett Wilson, Macungie, Pa.

[73] Assignee: Lucent Technologies Inc., Murray Hill, N.J.

[21] Appl. No.: 09/126,032

[22] Filed: Jul. 29, 1998

[51] Int. Cl.$^7$ ........................................ H01L 29/72
[52] U.S. Cl. ..................... 257/296; 257/306; 257/309; 257/379; 257/532; 438/396; 438/399
[58] Field of Search ................................ 257/296, 306, 257/309, 329, 532; 438/396, 399

[56] References Cited

U.S. PATENT DOCUMENTS 5,917,230  6/1999  Aldrich ................................ 257/532

OTHER PUBLICATIONS

Fractal Capacitors, H. Samavati, et al., 1998 ISSCC, Sesion 16, TD: Advanced Radio–Frequency Circuits, Paper FP 16.6, 256–57.

*Primary Examiner*—Edward Wojciechowicz

[57] ABSTRACT

An on-chip capacitor structure comprising a lower metal layer and an upper metal layer; an array of metal islands disposed between the lower and the upper metal layers; each island of the array of islands being electrically connected to either the lower layer or the upper layer such that no two adjacent islands are connected to the same layer.

28 Claims, 6 Drawing Sheets

ON-CHIP CAPACITOR STRUCTURE

FIELD OF THE INVENTION

This invention relates to the structure of an integrated circuit, and in particular, to a novel on-chip integrated circuit capacitor structure.

BACKGROUND OF THE INVENTION

As on-chip frequencies increase, there is a need to provide on-chip bypass capacitance to reduce the amount of noise current flowing through the power supply rails. The prior art analog macrocell uses accumulation-biased transistors for their high capacitance per unit area. Another prior art technique involves running supply rails on top of each other to get the benefit of the parasitic parallel plate capacitance. A recent paper, i.e., Fractal Capacitors, H. Samavati, et al., 1998 ISSCC, Session 16, TD: Advanced Radio-Frequency Circuits, Paper FP 16.6, 256–57, incorporated herein by reference, points out that sidewall or fringing capacitance yields a higher capacitance per unit area than conventional parallel plate capacitors as the distance between the plates decreases. The present invention is directed at using fringing capacitance to obtain increased capacitance on an integrated circuit in order to bypass supply lines with no resulting area penalty.

SUMMARY OF THE INVENTION

The present invention provides a novel integrated circuit structure for achieving increased capacitance. The novel structure is also well suited for on-chip noise reduction and/or decoupling/bypassing the power supplies on the integrated circuit. The structure generally consists of an array of square-shaped metal islands sandwiched between two layers of metal supply rails, wherein the islands are alternately connected to either the top or bottom layer. That is, when viewed in plan, each adjacent island is alternately connected to either of the top or bottom metal layers such that no two adjacent islands are connected to the same layer.

The prior art integrated circuit structure consists of three layers of metal separated by a standard dielectric to achieve parallel plate capacitance. A voltage potential is applied to the middle layer with the two outer layers being connected in parallel. Such a structure is the conventional parallel plate capacitor. The total capacitance exhibited by the prior art is the sum of the capacitance between the middle layer and the top layer $C_1$ and between the middle layer and the bottom layer $C_2$. Assuming that $C_1$ equals $C_2$, then the total capacitance of the prior art structure is $2C_1$.

The present invention consists of an array of square metal islands sandwiched between two layers of metal, with all elements being separated by a standard dielectric. Each adjacent island is alternately electrically connected to the upper or lower layer via vertical risers or vias. A voltage potential is applied to the top layer which is electrically connected to the bottom layer. Constructed as such, there exists a conventional vertical parallel plate capacitance between each island and either the bottom or upper layers. There also exists a conventional lateral parallel plate capacitance between each adjacent island. The total capacitance exhibited by the structure of the present invention is the sum of the conventional vertical and conventional lateral parallel plate capacitance, plus the additional fringe capacitance $C_F$ that exists between both the adjacent islands and between the islands and the bottom and upper layers.

As taught by the Samavati et al. paper, the fringing capacitance $C_F$ can be greater than the parallel plate capacitance $C_1$ as the structures get closer together. Thus, as the islands and metal layers get close enough together with fine line technology, the fringing capacitance $C_F$ exceeds the conventional parallel plate capacitance $C_1$, and therefore the total capacitance of the present invention $(C_1+C_F)$ exceeds the total capacitance of the structure of the prior art $(2C_1)$. It will also be recognized from the teachings herein that for finer line technologies, as the distance between islands decreases to a point where that distance is substantially less than the distance between layers, the conventional parallel plate capacitance becomes so large that the capacitance of the present invention greatly exceeds $2C_1$, the total capacitance of the prior art. As the structures get even closer together, one gets the added benefit of the fringe capacitance between the vias themselves which increases the capacitance of the structure further. Also, as more levels of metal are added, the additional lateral and fringing capacitance provide even more total capacitance. One of skill in the art will readily recognize that any number of layers of metal islands can be provided without departing from the spirit of the invention. Furthermore, while the preferred embodiment comprises the use of square metal islands, the use of alternate shaped islands is merely a matter of design choice. Furthermore, the fabrication of the integrated circuit structure of the present invention can be any art recognized metallic layer forming process.

It is often necessary or desirable to electrically connect additional elements on an integrated circuit that are an opposite sides of the supply rails. In the prior art structure, this would require a complex structure because the supply rails and middle layer were a continuous layer of metal and therefore one would have to route the signal around the layers without intersecting the layers. One of skill in the art will recognize that in the present invention, signals can easily be routed across the integrated circuit by merely removing one row or column of the metal islands and replacing it with a solid connection. Accordingly, in the present invention, signals can easily be run across the integrated circuit.

All prior art integrated circuit chips have un-utilized space (white space). This prior art white space is generally filled with a metal fill pattern to avoid having to dissolve large quantities of metal during manufacturing. One of skill in the art will readily recognize that this previously wasted white space can be filled with the structure of the present invention to further increase the capacitance potential of the integrated circuit without using any more space on the integrated circuit.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

DESCRIPTION OF THE DRAWING FIGURES

In the drawing figures, which are not to scale, and which are merely illustrative, and wherein like reference designators depict like elements throughout the several views.

Figure 10:
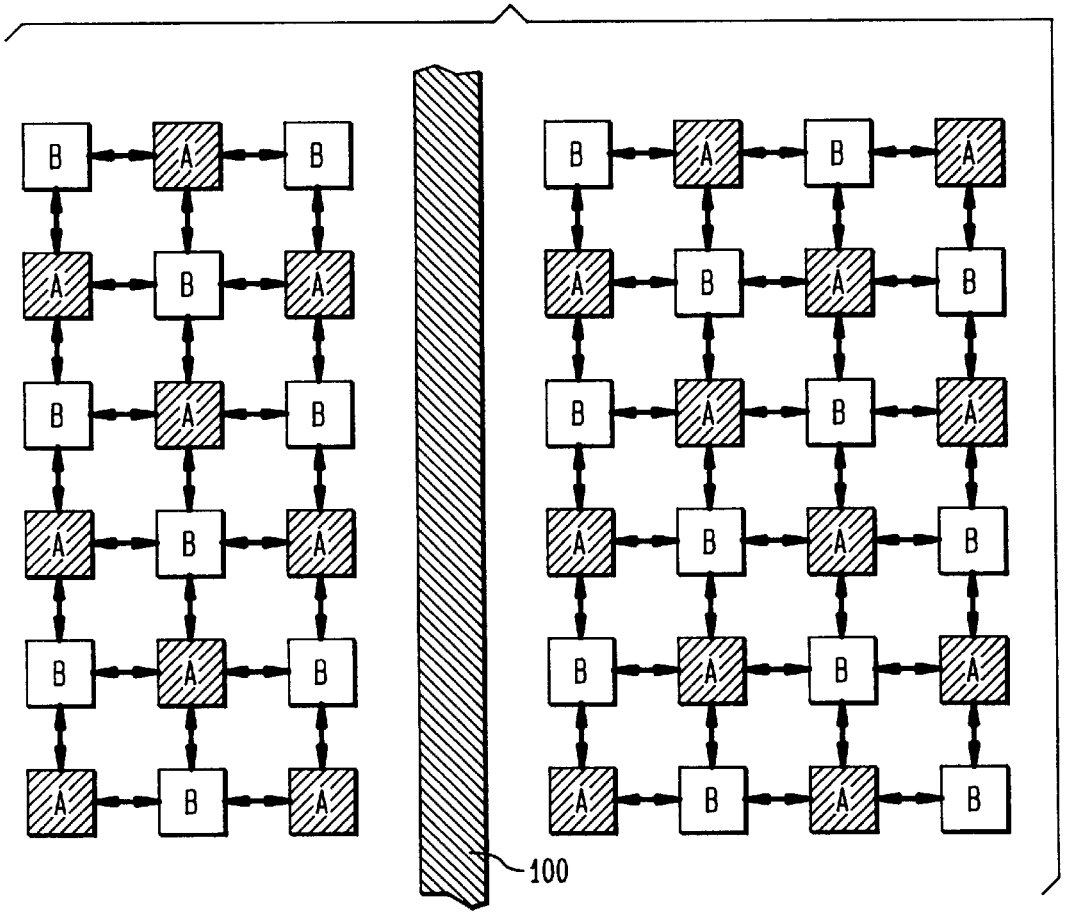
Figure 11:
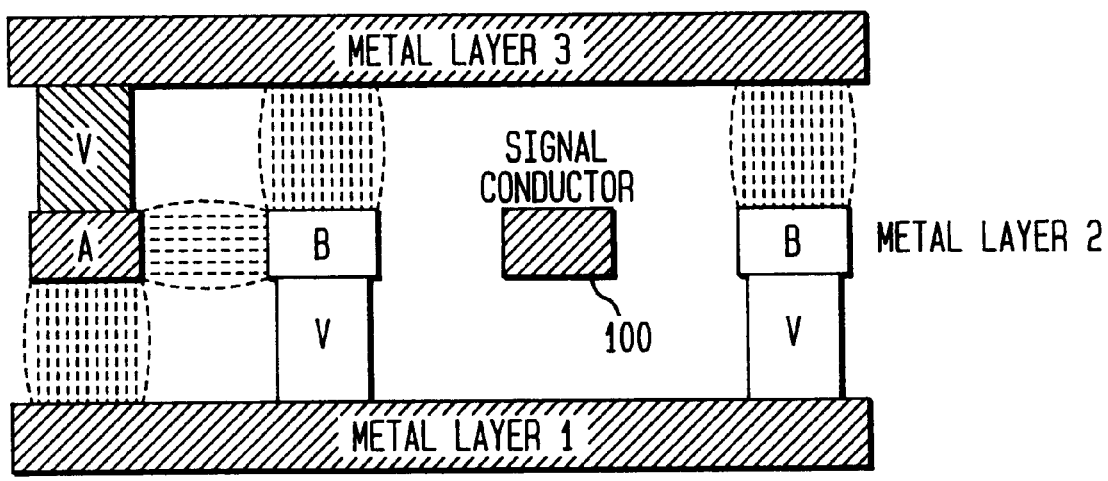

FIG. 10 is a partial top sectional plan view of the islands of the on-chip capacitor integrated circuit structure constructed in accordance with a first preferred embodiment of the present invention wherein one row of islands are electrically connected to each other forming a conductor across the integrated circuit between metal layers; and FIG. 11 is side sectional view of the on-chip capacitor integrated circuit of FIG. 10.

DETAILED DESCRIPTION OF THE PREFERRED EMBODIMENTS

Figure 2:
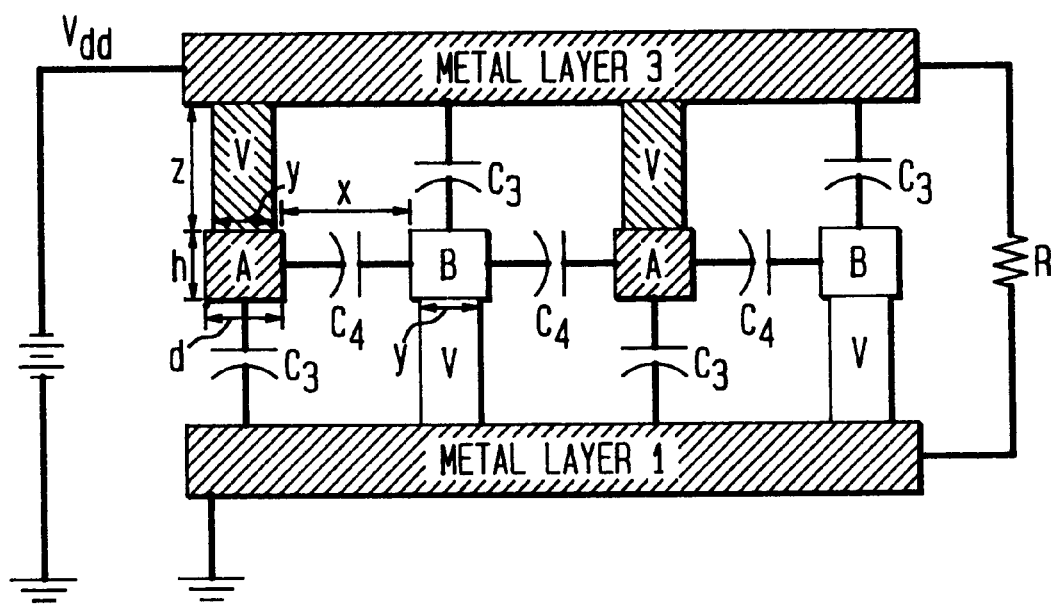
FIG. 2 is side view of the on-chip capacitor integrated circuit structure constructed in accordance with a first preferred embodiment of the present invention.
Figure 3:
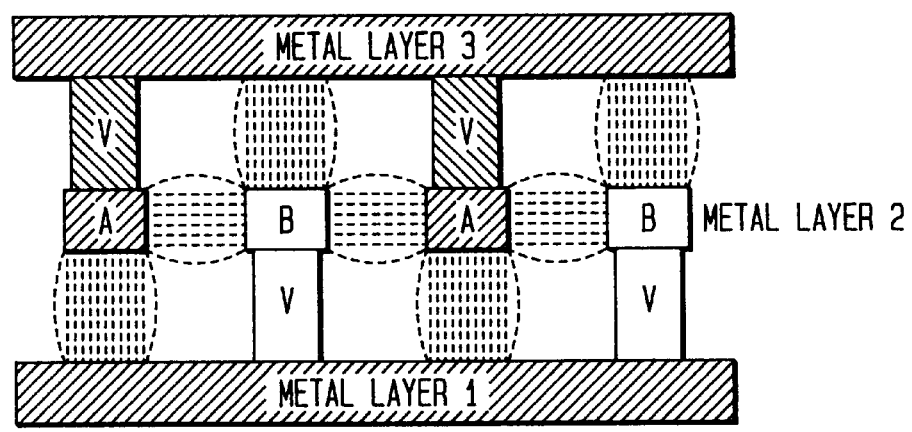
FIG. 3 is a side view of the on-chip capacitor integrated circuit structure constructed in accordance with a first preferred embodiment of the present invention.
Figure 4:
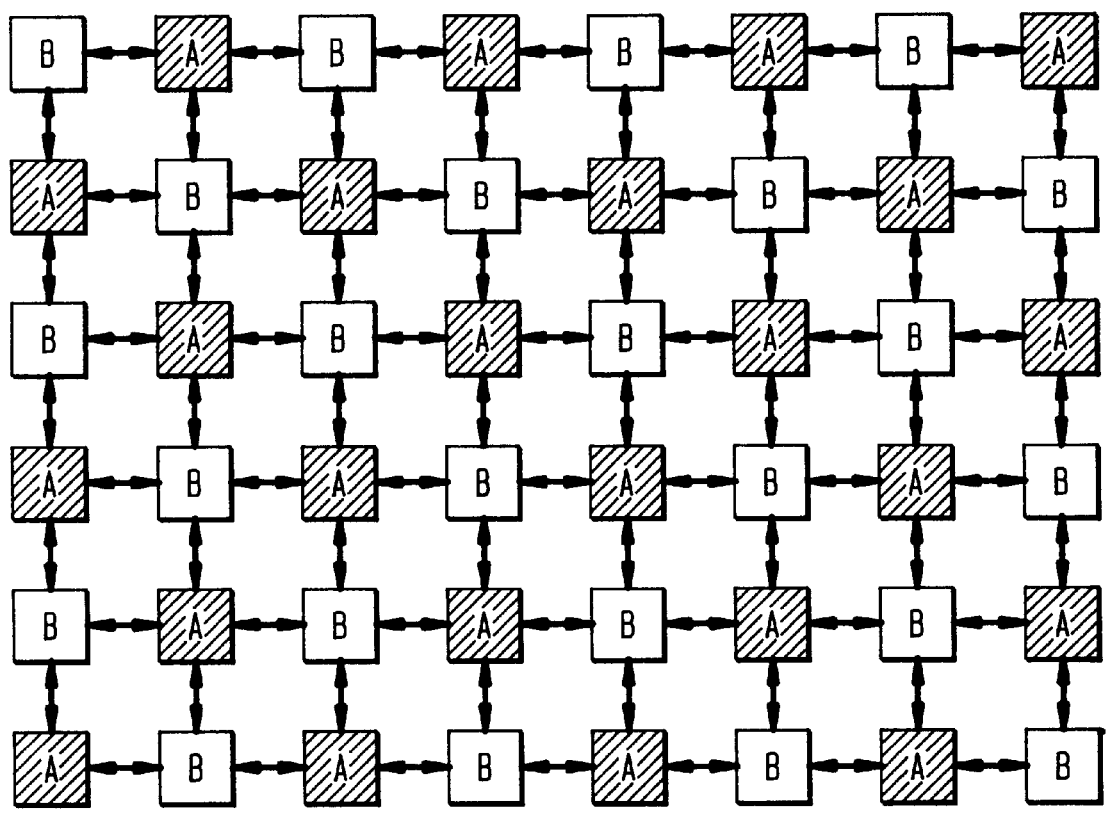
FIG. 4 is a partial top sectional plan view of the islands of the on-chip capacitor integrated circuit structure constructed in accordance with a first preferred embodiment of the present invention.

FIGS. 2 through 6 depict an on-chip capacitor structure constructed according to a preferred embodiment of the present invention. The capacitor structure generally consists of an array of polygonal, e.g. square-shaped metal islands sandwiched between two layers of metal supply rails, wherein the islands are alternately connected to either the top or bottom layer. That is, when viewed in plan, each adjacent island is alternately connected to either of the top or bottom metal layers such that no two adjacent islands are connected to the same layer. For the purposes of the present invention, and as used herein, the term adjacent is used to describe islands that are not electrically connected to the same layer and that have a lateral parallel plate capacitance between them. For example, as seen in FIG. 2, there is a lateral parallel plate capacitance $C_4$ between each A metal island and the B metal islands on either side thereof. Thus, island A is adjacent to island B. As seen in FIG. 4, there is a lateral parallel plate capacitance, represented as vertical and horizontal lines with arrows, between each A island and the four B islands which surround it. Similarly, there is a parallel plate capacitance between each B island and the four A islands which surround it. Thus, as seen in FIG. 4, adjacent islands are those islands which are connected by a horizontal or vertical lines.

Figure 9:
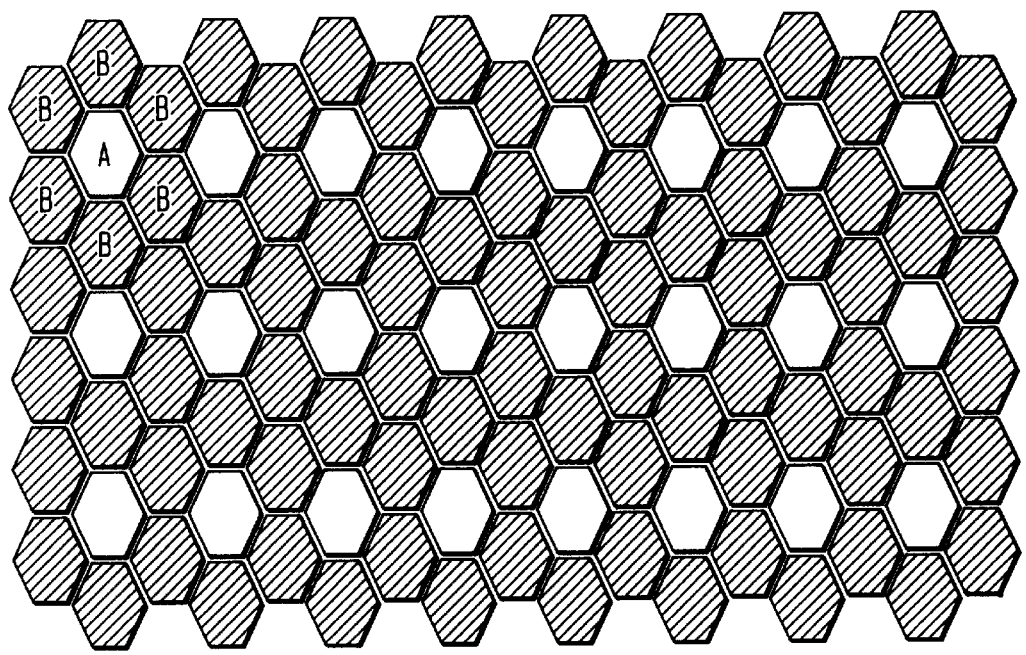
FIG. 9 is a partial top plan view of the on-chip capacitor integrated circuit structure constructed in accordance with an alternative embodiment of islands of the present invention.

As seen in FIG. 9, in an alternate embodiment each A island may be surrounded by six B islands. There is a lateral parallel plate capacitance between each side of the A island and the corresponding side of the B island which opposes it. Thus, as seen in FIG. 9, the A island is adjacent, as that term is used herein, to six B islands. The B islands, while physically "adjacent", are not adjacent to each other as the term adjacent is used herein, since the B islands are electrically connected to the same layer and thus are at substantially the same voltage potential. Thus while conventional parallel plate capacitance can exist between islands that are at the same potential (such as the B islands in FIG. 9), such capacitance can be ignored for the purposes of the present invention and does not render such islands adjacent as that term is used herein.

Figure 1:
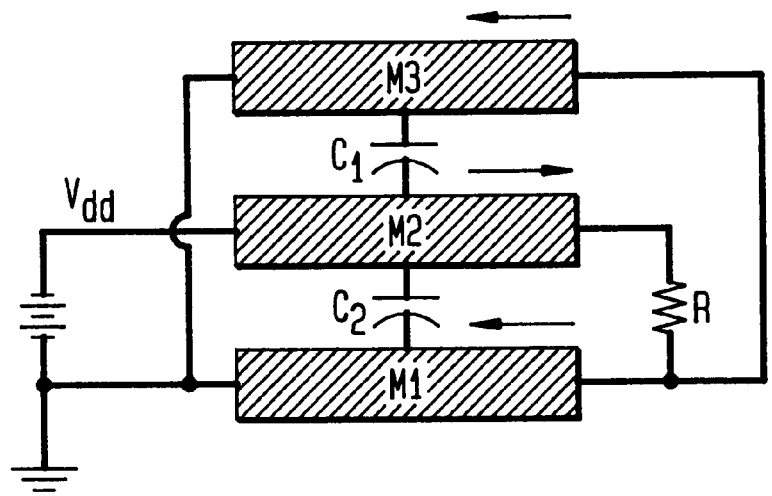
FIG. 1 is a side view of a conventional parallel plate capacitor integrated circuit structure constructed in accordance with the prior art.

The prior art integrated circuit structure consists of three layers of metal separated by a standard dielectric to achieve parallel plate capacitance. As seen in FIG. 1, a voltage potential is applied to the middle layer M2. M2 is electrically connected to layer M1 via resistor R and M1 is connected in parallel to layer M3. Such a structure is the conventional parallel plate capacitor. The total capacitance exhibited by the structure of FIG. 1 is the sum of the capacitance between M1 and M2, e.g., $C_1$, and between M2 and M3, e.g., $C_2$. If it is assumed that $C_1$ is equal to $C_2$, then the total capacitance $C_T$ of the prior art capacitor is $2C_1$.

As seen in FIGS. 2 through 4, the present invention consists of an array of square metal islands A and B sandwiched between two layers of metal, with all elements being separated by a standard dielectric (not shown). As seen in FIG. 2, each adjacent island, as defined above, is alternately electrically connected to Metal Layer 1 or Metal Layer 3 via vertical risers or vias V. Thus, parallel plate capacitance $C_3$ exists across distance z between each island and the metal layer to which it is not connected. The width y of the vias V are preferably, although not necessarily, substantially the same width d as the islands themselves, within the tolerances of art-recognized manufacturing techniques. However, for the purposes of clarity only, the width y of vias V depicted in the FIGS. are less than the width d of the islands. Also, in a preferred embodiment, in order to increase the total lateral parallel plate capacitance $C_4$ between each adjacent island, the distance x between each adjacent island is as small as possible. The distance x in the FIGS. is exaggerated for clarity. One of skill in the art will recognize that the geometry of the structural components of the present invention, for example the width y of the vias, as well as the distance x between the islands, the height h of the islands, as well as the shape, dimensions and thickness of the islands themselves, are all a matter of design choice, art-recognized manufacturing techniques and geometry rules. As seen in FIGS. 3 through 11, if the islands are alternately labeled as A and B, wherein the A islands are connected to Metal Layer 3 and the B islands are connected to Metal Layer 1, then no two adjacent islands are connected to the same metal layer. That is, no A island is adjacent to another A island and no B island is adjacent to another B island.

Figure 5:
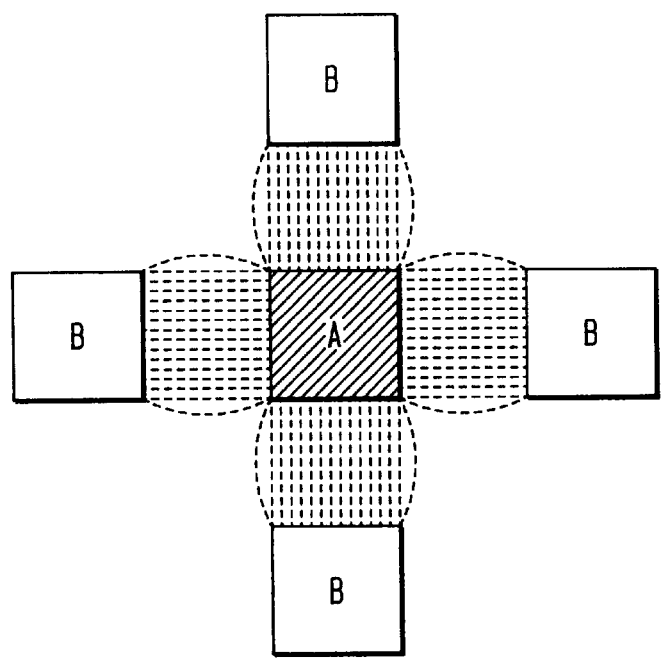
FIG. 5 is a top plan detail view of a group of islands of the on-chip capacitor integrated circuit structure depicted in FIG. 4.

As seen in FIG. 2, a voltage potential is applied to the top layer, Metal Layer 3. Metal Layer 3 is electrically connected to Metal Layer 1 via resistor R. In this embodiment, by way of a non-limiting example, each A and B metal island is of equal size (FIG. 2) and thickness (FIG. 3). There exists conventional vertical parallel plate capacitance $C_3$ between each island and either of Metal Layer 1 or Metal Layer 3. There also exists the conventional lateral parallel plate capacitance $C_4$ between each adjacent island. However, as seen in FIGS. 3 through 5, in a lateral direction, each metal island shares its lateral capacitance with other islands. That is, as seen in FIG. 5, island A is surrounded by four B islands, one on each side, and there exists a lateral capacitance, both conventional and fringing, between the A island and each B island. As seen in FIG. 4, each island B that surrounds island A is also shared with another A island.

Figure 6:
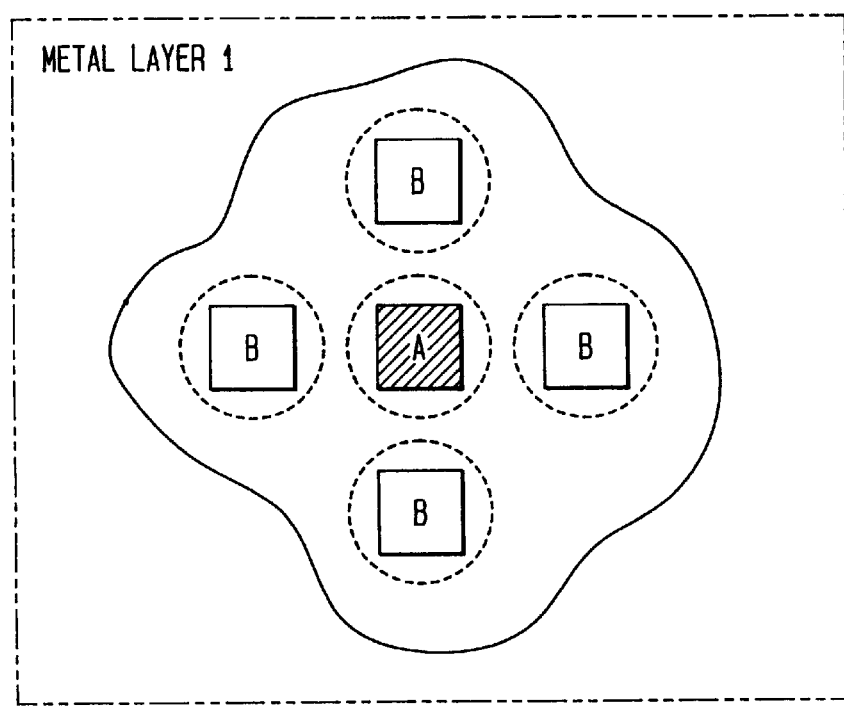
FIG. 6 is a top plan cutaway detail view of a group of islands of the on-chip capacitor integrated circuit structure depicted in FIG. 5 as seen through a cutaway in metal layer 1.

As seen in FIGS. 3 through 6, as the structures get close together, there exists a lateral fringe capacitance between each adjacent island and a vertical fringe capacitance between the islands and the metal layers. As seen in FIG. 5, the lateral fringe capacitance is depicted as the lateral curved flux lines between the adjacent islands. As seen in FIGS. 3 and 6, the vertical fringe capacitance is depicted as the vertical curved flux lines between the islands and the metal layers (FIG. 3). As seen in FIG. 6, each island is essentially surrounded by a cylinder of vertical fringe capacitance. Thus, as the lateral distance x between each adjacent island decreases and as the vertical distance z between the islands and the metal layers decreases, the total capacitance exhibited by the structure of FIG. 2 is actually the total conventional parallel plate capacitance $C_{conv}$ (e.g. $nC_3+mC_4$) plus the additional fringe capacitance $C_F$. That is, the total capacitance of the structure depicted in FIG. 2 is $C_{conv}$ plus the additional fringe capacitance $C_F$ that exists between both the adjacent islands A and B and between the alternating islands A and B and Metal Layer 1 and Metal Layer 3.

As taught by the Samavati et al. paper, the fringing capacitance $C_F$ can be greater than the conventional parallel plate capacitance as the structures get closer together. Indeed as the structures get close enough together with fine line technology, the fringing capacitance $C_F$ may in fact exceed $C_{conv}$. Therefore the total capacitance $C_T$ of the present invention as depicted in FIG. 2 (i.e., $C_{conv}+C_F$) exceeds the total capacitance of the prior art structure depicted in FIG. 1 ($2C_1$), and may far exceed it as fine line technology evolves.

One of skill in the art will recognize that the total distance between Metal Layer 1 and Metal Layer 3 is generally a fixed distance based on the current technology, manufacturing processes and uses for integrated circuits. Thus, the optimal or maximum capacitance of the circuit can be achieved by altering the geometry of the components contributing to the total capacitance of the circuit, i.e., the conventional vertical and lateral capacitance as well as the vertical and lateral fringe capacitance. In a preferred embodiment of the present invention, the total capacitance of the circuit can be optimized to suit the capacitive requirements of a given application or maximized by altering all critical geometric variables to yield maximum capacitance for a given application within the limits of the then-currently applied state of the art. In the present invention, this is accomplished by altering the geometry of the structure, i.e. the size, shape and spatial relationships of the components. That is, the size and shape of the components and the spatial relationships therebetween that contribute to the total capacitance of the present invention, such as, for example the height of the islands, the distance between adjacent islands, the distance between two or more arrays of islands, or the width or shape of the vias, layer spacing, etc., can be optimized in order to achieve the maximum capacitance achievable. Alternately, as mentioned the geometry of the structure can be designed so as to achieve a predetermined total capacitance.

Figure 7:
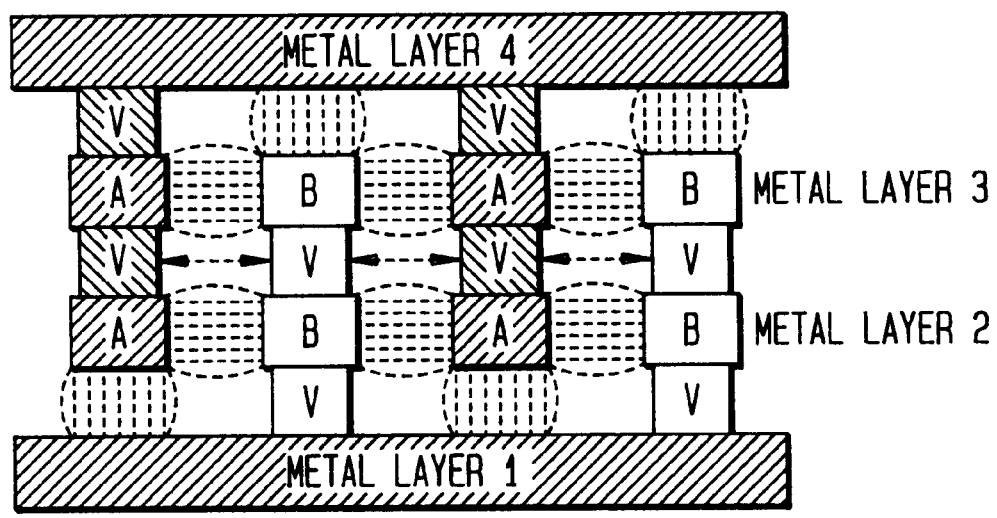
FIG. 7 is a side view of the on-chip capacitor integrated circuit structure constructed in accordance with a second preferred embodiment of the present invention.
Figure 8:
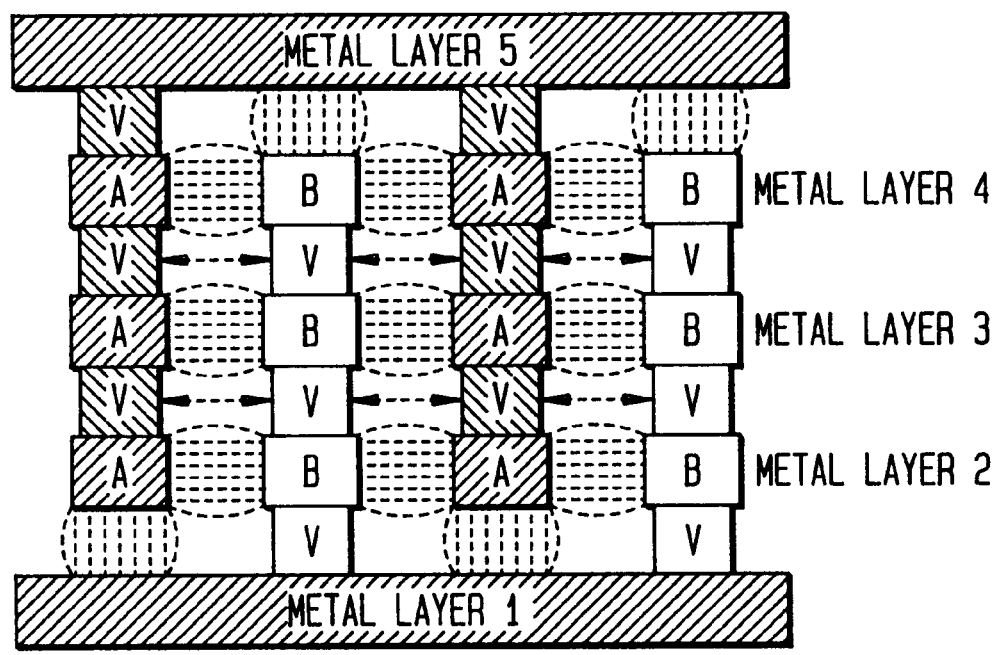
FIG. 8 is a side view of the on-chip capacitor integrated circuit structure constructed in accordance with a third preferred embodiment of the present invention.

One of skill in the art will readily recognize that any number of layers of metal islands (FIGS. 7 and 8) can be provided without departing from the spirit of the invention. Furthermore, as seen in FIGS. 7 and 8, as the structures get even closer together with fine line technology, one gets the added benefit of the fringe capacitance between the vias themselves which increases the capacitance of the structure even further.

Furthermore, while the preferred embodiment comprises the use of square metal islands, the use of alternately shaped islands and/or vias is merely a matter of design choice (FIG. 9). Furthermore, the fabrication of the integrated circuit structure of the present invention can be any art-recognized metallic layer forming process.

It is often necessary or desirable to electrically connect additional elements on an integrated circuit that are on opposite sides of the supply rails. In the prior art structure (FIG. 1), this would require a complex structure because the supply rails and middle layer are a continuous layer of metal and therefore one would have to route the signal around the layers without intersecting the layers. One of skill in the art will recognize that in the present invention, as seen in FIGS. 10 and 11, signals can easily be routed across the integrated circuit by merely removing one row or column of the metal islands, and their corresponding vias, and replacing the row or column with a solid conductor 100. Accordingly, in the present invention, signal paths can easily be established across the integrated circuit via conductor 100.

All prior art integrated circuit chips have un-utilized space (white space) wherein no circuitry components are located. This prior art white space is generally filled with a metal fill pattern to avoid having to dissolve large quantities of metal during manufacturing. One of skill in the art will readily recognize that this previously wasted white space can be filled with the structure of the present invention to further increase the capacitance potential of the integrated circuit without using any more space on the integrated circuit. That is, an integrated circuit of the present invention comprises using the capacitance structure as described herein in an area of the integrated circuit which is devoid of circuitry components.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. An on-chip capacitor structure comprising:
   a lower metal layer and an upper metal layer separated by a dielectric; and
   an array of metal islands disposed on a plane between said lower and said upper metal layers, each island of said array of islands electrically connected to either said lower layer or said upper layer such that no two adjacent islands are connected to the same layer.

2. The on-chip capacitor structure according to claim 1, wherein said islands are square-shaped when viewed in plan.

3. The on-chip capacitor structure according to claim 1, wherein the distance between each adjacent island is optimized to provide a maximum total capacitance.

4. The on-chip capacitor structure according to claim 1, wherein the width of said electrical connection is substantially equal to the width of said island.

5. The on-chip capacitor structure according to claim 1, wherein the distance between said lower metal layer and said islands, the distance between said upper metal layer and said islands, and the distance between adjacent islands, is optimized to provide a maximum total capacitance.

6. The on-chip capacitor structure according to claim 1, wherein the geometry of the structure is optimized to provide a maximum total capacitance.

7. The on-chip capacitor structure according to claim 1, wherein the distance between said lower metal layer and said islands, the distance between said upper metal layer and said islands, and the distance between adjacent islands, is optimized to yield a predetermined capacitance.

8. The on-chip capacitor structure according to claim 1, wherein the geometry of the structure is optimized to yield a predetermined capacitance.

9. The on-chip capacitor structure according to claim 1, wherein said lower metal layer and said upper metal layer are supply rails.

10. The on-chip capacitor structure according to claim 1, wherein an integrated circuit comprises said structure in an area of said circuit devoid of circuitry components.

11. An on-chip capacitor structure comprising:
- a lower metal layer and an upper metal layer separated by a dielectric; and
- an array of metal islands disposed on a plane between said lower and said upper metal layers, each island of said array of islands, with the exception of one selected row or column thereof, is electrically connected to either said lower layer or said upper layer such that no two adjacent islands are connected to the same layer; and
- wherein each island of said selected row or column of metal islands is electrically connected to each other, forming a conductor across said on-chip capacitor structure extending between said upper layer and said lower layer.

12. An on-chip capacitor structure comprising:
- a lower metal layer and an upper metal layer; and
- a first array of metal islands disposed on a first plane between said lower and said upper metal layers, and a second array of metal islands disposed on a second plane between said lower and said upper metal layers;
- wherein said first array of metal islands and said second array of metal islands are formed in a substantially similar patterns; and
- wherein each island of said first array of islands is electrically connected to either said lower metal layer or to an island of said second array of islands, and each island of said second array of islands is electrically connected to either said upper metal layer or to an island of said first array of islands, such that no two adjacent islands in said first array of islands, and no two adjacent islands in said second array of islands, are connected to the same layer.

13. The on-chip capacitor structure according to claim 12, wherein said first array of islands and said second array of islands are square-shaped.

14. The on-chip capacitor structure according to claim 12, wherein said lower metal layer and said upper metal layer are supply rails.

15. The on-chip capacitor structure according to claim 12, wherein the distance between each adjacent island in said first array of islands is optimized to provide a maximum total capacitance.

16. The on-chip capacitor structure according to claim 12, wherein the distance between each adjacent island in said second array of islands is optimized to provide a maximum total capacitance.

17. The on-chip capacitor structure according to claim 12, wherein the width of each island of said first array of islands is substantially equal to the width of each island of said second array of islands.

18. The on-chip capacitor structure according to claim 12, wherein the width of said electrical connections are substantially equal to the width of said islands.

19. The on-chip capacitor structure according to claim 12, wherein the distance between said lower metal layer and said first array of islands is optimized to provide a maximum total capacitance.

20. The on-chip capacitor structure according to claim 12, wherein the distance between said upper metal layer and said second array of islands is optimized to provide a maximum total capacitance.

21. The on-chip capacitor structure according to claim 12, wherein the geometry of the structure is optimized to provide a maximum total capacitance.

22. The on-chip capacitor structure according to claim 12, wherein the geometry of the structure is optimized to yield a predetermined capacitance.

23. An on-chip capacitor structure comprising:
- a first metal layer and a second metal layer disposed in spaced parallel planar relationship; and
- an array of polygonal metal islands disposed in parallel planar relationship between said lower and said upper metal layers, each island of said array of islands being electrically connected to one of said first layer or said second layer such that an island connected to said first layer is surrounded on at least two sides by an island connected to said second layer.

24. A method of forming an on-chip capacitor structure comprising the steps of:
- (a) forming a lower metal layer;
- (b) forming an array of lower vias electrically connected to said lower metal layer and extending upwards from said lower metal layer;
- (c) forming an array of metal islands disposed on a plane above said lower metal layer;
- (d) forming an array of upper vias electrically connected to said array of metal islands and extending upwards from said array of metal islands;
- (e) forming an upper metal layer electrically connected to said upper vias; and
- (f) connecting each island of said array of metal islands formed in step (c) to either said lower layer or said upper layer by the vias formed in steps (b) and (d) such that no two adjacent islands are connected to the same layer.

25. The method of forming an on-chip capacitor structure according to claim 22, further comprising the step of:
- (f) forming said structure described in steps (a) through (f) in an area of an integrated circuit which is devoid of circuitry components.

26. A method of forming an on-chip capacitor structure comprising the steps of:
- (a) forming a lower metal layer and an upper metal layer; and
- (b) forming a first array of metal islands disposed on a first plane between said lower and said upper metal layers, and a second array of metal islands disposed on a second plane between said lower and said upper metal layers, such that said first array of metal islands and said second array of metal islands are formed in a substantially similar patterns; and
- (c) connecting each island of said first array of islands to either said lower layer or to an island of said second array of islands, and connecting each island of said second array of islands to either said upper layer or to an island of said first array of islands, such that no two adjacent islands in said first array of islands, and no two adjacent islands in said second array of islands, are connected to the same layer.

27. The method of forming an on-chip capacitor structure according to claim 26, further comprising the step of:
(f) forming said structure described in steps (a) through (c) in an area of an integrated circuit which is devoid of circuitry components.

28. A method of forming an on-chip capacitor structure comprising the steps of: forming a first metal layer and a second metal layer disposed in spaced parallel planar relationship;

forming an array of polygonal metal islands disposed in parallel planar relationship between said lower and said upper metal layers; and electrically connecting each island of said array of islands to one of said first layer or said second layer such that an island connected to said first layer is surrounded on at least two sides by an island connected to said second layer.

\* \* \* \* \*